(12) United States Patent
Jang

(10) Patent No.: US 9,154,092 B2
(45) Date of Patent: Oct. 6, 2015

(54) AMPLIFICATION CIRCUIT OF SEMICONDUCTOR APPARATUS

(71) Applicant: SK hynix Inc., Icheon-si Gyeonggi-do (KR)

(72) Inventor: Mun Seon Jang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 23 days.

(21) Appl. No.: 14/100,872

(22) Filed: Dec. 9, 2013

(65) Prior Publication Data

US 2015/0061763 A1 Mar. 5, 2015

(30) Foreign Application Priority Data

Aug. 30, 2013 (KR) .................. 10-2013-0103804

(51) Int. Cl.
*H03F 3/45* (2006.01)

(52) U.S. Cl.
CPC .. *H03F 3/45183* (2013.01); *H03F 2203/45674* (2013.01)

(58) Field of Classification Search
USPC .......................................... 330/253, 257, 310
IPC .......................................................... H03F 3/45
See application file for complete search history.

(56) References Cited

FOREIGN PATENT DOCUMENTS

KR     1020020066941 A     8/2002

*Primary Examiner* — Patricia T Nguyen
(74) *Attorney, Agent, or Firm* — William Park & Associates Ltd.

(57) ABSTRACT

An amplification circuit of a semiconductor apparatus includes a first amplification unit configured to amplify a difference between an input voltage and a reference voltage and generate a preliminary amplification signal, a second amplification unit configured to secondarily amplify the preliminary amplification signal and generate an amplification signal, and a compensation unit configured to form an addition current path.

23 Claims, 3 Drawing Sheets

AMPLIFICATION CIRCUIT OF SEMICONDUCTOR APPARATUS

CROSS-REFERENCES TO RELATED APPLICATION

The present application claims priority under 35 U.S.C. §119(a) to Korean application number 10-2013-0103804, filed on Aug. 30, 2013, in the Korean Intellectual Property Office, which is incorporated herein by reference in its entirety as set forth in full.

BACKGROUND

1. Technical Field

Various embodiments relate to a semiconductor apparatus, and more particularly, to an amplification circuit of a semiconductor apparatus.

2. Description of the Related Art

In a semiconductor apparatus, as a process becomes fine, the level of an external voltage VDD is reduced, and the output characteristics of a transistor constituting the semiconductor apparatus is also reduced.

Accordingly, since the voltage gain of an amplification circuit used in the semiconductor apparatus is also reduced, it is necessary to provide an amplification circuit having a desired voltage gain characteristic in a condition that a low external voltage is used.

SUMMARY

An amplification circuit of a semiconductor apparatus, which has a desired voltage gain characteristic, is described herein.

In an embodiment of the invention, a semiconductor apparatus includes: an amplification circuit of a semiconductor apparatus includes: a first amplification unit configured to amplify a difference between an input voltage and a reference voltage and generate a preliminary amplification signal; a second amplification unit configured to secondarily amplify the preliminary amplification signal and generate an amplification signal; and a compensation unit configured to form an addition current path.

In an embodiment of the invention, a semiconductor apparatus includes: an amplification circuit of a semiconductor apparatus includes: a differential-input and single-ended amplifier configured to amplify a voltage difference between a first current path and a second current path and generate a preliminary amplification signal; a single-input and single-ended amplifier configured to secondarily amplify the preliminary amplification signal and generate an amplification signal; and a compensation unit configured to form a third current path and a fourth current path.

In an embodiment of the invention, an amplification circuit of a semiconductor apparatus includes: a first amplification unit configured to consume an operating current in a standby mode that is lower than an other operating current in an activation mode; and a compensation unit configured to form one or more current paths in the first amplification unit.

The present technology is able to provide an amplification circuit of a semiconductor apparatus, which has a desired voltage gain characteristic.

BRIEF DESCRIPTION OF THE DRAWINGS

Features, aspects, and embodiments are described in conjunction with the attached drawings, in which.

DETAILED DESCRIPTION

Hereinafter, an amplification circuit of a semiconductor apparatus according to the invention will be described in detail with reference to the accompanying drawings through an embodiment.

Figure 1:
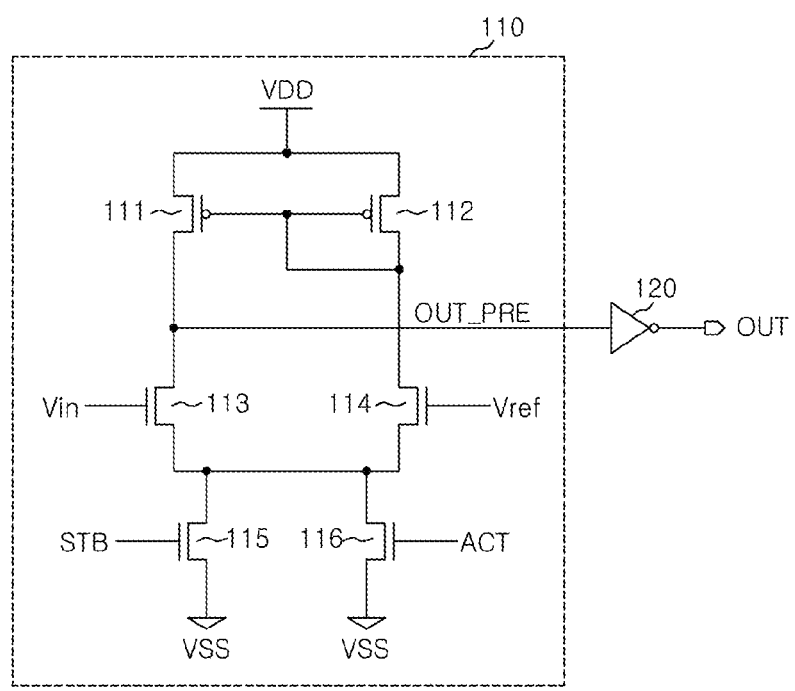
FIG. 1 is a circuit diagram of an amplification circuit 100 of a semiconductor apparatus according to an embodiment.

As illustrated in FIG. 1, an amplification circuit 100 of a semiconductor apparatus according to an embodiment may include a first amplification unit 110 and a second amplification unit 120.

The first amplification unit 110 may be configured to amplify the difference between an input voltage Vin and a reference voltage Vref and to generate a preliminary amplification signal OUT_PRE.

The first amplification unit 110 may be configured to change an operating current amount with respect to a standby mode and an activation mode.

In the standby mode, that is, at the time of activation of a standby mode signal STB, the first amplification unit 110 may be configured to consume a low operating current as compared with the activation mode, that is, at the time of activation of an active signal ACT.

At this time, the standby mode signal STB may be activated when the semiconductor apparatus is in the standby mode. When the active signal ACT may be activated when the semiconductor apparatus performs a data read or write operation.

The first amplification unit 110 may include a differential-input and single-ended amplifier.

The first amplification unit 110 may include first to sixth transistors 111 to 116.

The first transistor 111 may be configured to receive a power supply voltage (for example, VDD) through a source thereof and to generate the preliminary amplification signal OUT_PRE through a drain thereof.

The second transistor 112 may have a source to which the power supply voltage VDD is applied, and a gate that may be commonly electrically coupled to a drain of the second transistor 112 and a gate of the first transistor 111.

The third transistor 113 may have a drain electrically coupled to the drain of the first transistor 111, and a gate to which the input voltage Vin may be applied.

The fourth transistor 114 may have a drain electrically coupled to the drain of the second transistor 112, and a gate to which the reference voltage Vref may be applied.

The fifth transistor 115 may have a drain that is commonly electrically coupled to a source of the third transistor 113 and a source of the fourth transistor 114, a gate to which the standby mode signal STB is applied, and a source VSS that is grounded.

The sixth transistor 116 may have a drain that is commonly electrically coupled to the source of the third transistor 113 and the source of the fourth transistor 114, a gate to which the active signal ACT is applied, and a source VSS that is grounded.

At this time, the fifth transistor 115 may be designed to have low current drivability as compared with the sixth transistor 116.

That is, in the standby mode, the consumption amount of an operating current of the first amplification unit 110 may be reduced as compared with the activation mode.

The second amplification unit 120 may be configured to secondarily amplify and invert the preliminary amplification signal OUT_PRE and to generate an amplification signal OUT.

The second amplification unit 120 may include a single-input and single-ended amplifier.

The second amplification unit 120 may include an inverter.

The operation of the amplification circuit 100 may be configured as above according to an embodiment will be described as follows.

In the activation mode, that is, when the active signal ACT has been activated to a logic high, the standby mode signal STB may be deactivated to a logic low.

Since the active signal ACT has been activated to a logic high and the standby mode signal STB has been deactivated to a logic low, the fifth transistor 115 may be turned off and the sixth transistor 116 may be turned on.

The first to fourth transistors 111 to 114 may amplify the difference between the input voltage Vin and the reference voltage Vref by using an operating current decided by the sixth transistor 116, and generate the preliminary amplification signal OUT_PRE.

The second amplification unit 120 may secondarily amplify and invert the preliminary amplification signal OUT_PRE and generate the amplification signal OUT.

In the standby mode, that is, when the standby mode signal STB has been activated to a logic high, the active signal ACT may be deactivated to a logic low.

Since the standby mode signal STB has been activated to a logic high and the active signal ACT has been deactivated to a logic low, the sixth transistor 116 may be turned off and the fifth transistor 115 may be turned on.

The first to fourth transistors 111 to 114 may amplify the difference between the input voltage Vin and the reference voltage Vref by using an operating current decided by the fifth transistor 115, that is, a reduced operating current as compared with the sixth transistor 116, and generate the preliminary amplification signal OUT_PRE.

The second amplification unit 120 may secondarily amplify and invert the preliminary amplification signal OUT_PRE and generate the amplification signal OUT.

As described above, through secondary amplification, the amplification circuit 100 of the semiconductor apparatus according to an embodiment may be able to compensate for voltage gain reduction due to shrinkage in a process and reduction of the power supply voltage VDD.

Figure 2:
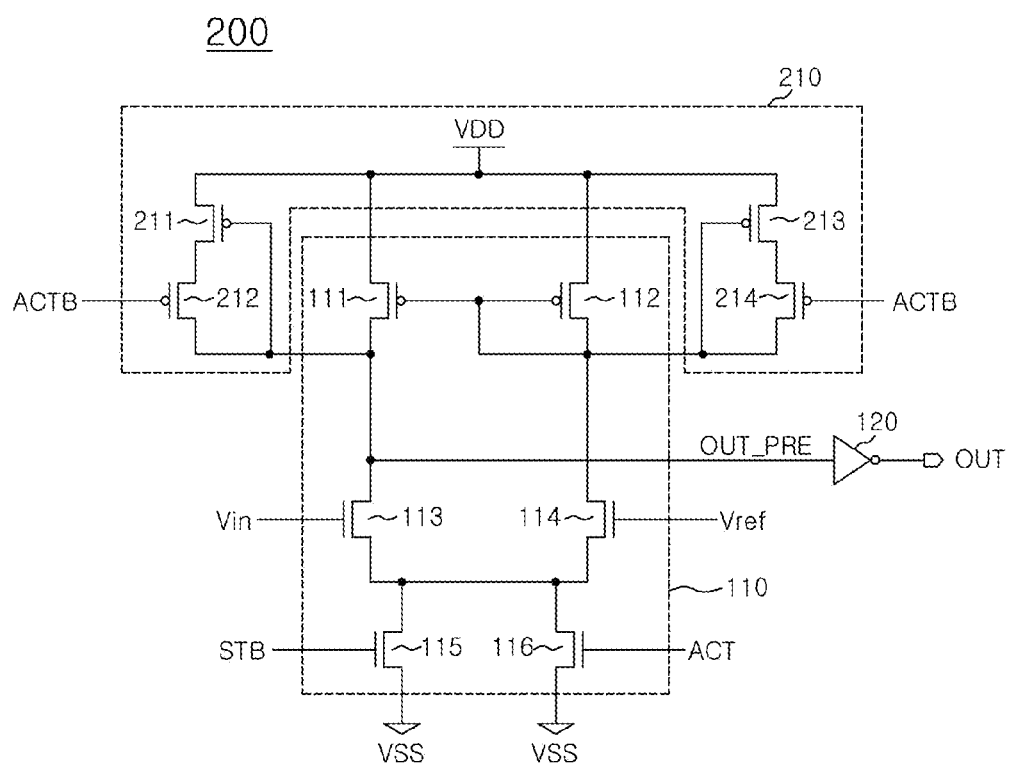
FIG. 2 is a circuit diagram of an amplification circuit 200 of a semiconductor apparatus according to an embodiment.

As illustrated in FIG. 2, an amplification circuit 200 of a semiconductor apparatus according to an embodiment may include a first amplification unit 110, a second amplification unit 120, and a compensation unit 210.

The first amplification unit 110 may be configured to amplify the difference between an input voltage Vin and a reference voltage Vref and to generate a preliminary amplification signal OUT_PRE.

The first amplification unit 110 may be configured to change an operating current with respect to a standby mode and an activation mode.

In the standby mode, that is, at the time of activation of a standby mode signal STB, the first amplification unit 110 may be configured to consume a low operating current as compared with the activation mode, that is, at the time of activation of an active signal ACT.

At this time, the standby mode signal STB may be activated when the semiconductor apparatus is in the standby mode.

When the active signal ACT may be activated when the semiconductor apparatus performs a data read or write operation.

The first amplification unit 110 may include a differential-input and single-ended amplifier.

The first amplification unit 110 may include first to sixth transistors 111 to 116.

The first transistor 111 may be configured to receive a power supply voltage (for example, VDD) through a source thereof and to generate the preliminary amplification signal OUT_PRE through a drain thereof. Further, the first transistor 111 may be configured to amplify a voltage difference between a first current path and a second current path and generate the preliminary amplification signal OUT_PRE.

The second transistor 112 may have a source to which the power supply voltage VDD is applied, and a gate that is commonly electrically coupled to a drain of the second transistor 112 and a gate of the first transistor 111.

The third transistor 113 may have a drain electrically coupled to the drain of the first transistor 111, and a gate to which the input voltage Vin is applied.

The fourth transistor 114 may have a drain electrically coupled to the drain of the second transistor 112, and a gate to which the reference voltage Vref is applied.

The fifth transistor 115 may have a drain that is commonly electrically coupled to a source of the third transistor 113 and a source of the fourth transistor 114, a gate to which the standby mode signal STB is applied, and a source VSS that is grounded.

The sixth transistor 116 may have a drain that is commonly electrically coupled to the source of the third transistor 113 and the source of the fourth transistor 114, a gate to which the active signal ACT is applied, and a source VSS that is grounded.

At this time, the fifth transistor 115 may be designed to have low current drivability as compared with the sixth transistor 116.

That is, in the standby mode, the consumption amount of an operating current of the first amplification unit 110 may be reduced as compared with the activation mode.

The first amplification unit 110 may include a first current path, that is, an input current path that may have a current amount controlled by the input voltage Vin, and a second current path, that is, a reference current path that may have a current amount controlled by the reference voltage Vref.

The first current path may include the first transistor 111, the third transistor 113, and the fifth transistor 115 or the sixth transistor 116.

The first current path in the activation mode, that is, when the active signal ACT has been activated, may include the first transistor 111, the third transistor 113, and the sixth transistor 116.

The first current path in the standby mode, that is, when the standby mode signal STB has been activated, may include the first transistor 111, the third transistor 113, and the fifth transistor 115. Accordingly, an operating current of the first current path may be configured to be changed in response to the standby mode and the active signal ACT.

The second current path may include the second transistor 112, the fourth transistor 114, and the fifth transistor 115 or the sixth transistor 116.

The second current path in the activation mode, that is, when the active signal ACT has been activated, may include the second transistor 112, the fourth transistor 114, and the sixth transistor 116.

The second current path in the standby mode, that is, when the standby mode signal STB has been activated, may include the second transistor 112, the fourth transistor 114, and the fifth transistor 115. Accordingly, an operating current of the second current path may be configured to be changed in response to the standby mode signal STB and the active signal ACT.

The second amplification unit 120 may be configured to secondarily amplify and invert the preliminary amplification signal OUT_PRE and to generate an amplification signal OUT.

The second amplification unit 120 may include a single-input and single-ended amplifier.

The second amplification unit 120 may include an inverter.

The compensation unit 210 may be configured to form additional current paths in the first amplification unit 110 in response to the active signal ACT. The compensation unit 210 may also be configured to compensate for a difference between an output operating point, which may define a level of the preliminary amplification signal OUT_PRE when the input voltage Vin is substantially equal to the reference voltage Vref, and a threshold voltage level of the second amplification unit 120 through the additional current path.

The compensation unit 210 may include seventh to tenth transistors 211 to 214.

The seventh transistor 211 may have a source to which the power supply voltage VDD is applied, and a gate electrically coupled to the drain of the first transistor 111.

The seventh transistor 211 may be configured to operate as a first diode.

The eighth transistor 212 may have a source electrically coupled to a drain of the seventh transistor 211, a gate through which an inverted active signal ACTB is received, and a drain electrically coupled to the gate of the seventh transistor 211.

When the inverted active signal ACTB has been activated to a logic low, the eighth transistor 212 may operate as a first switch for allowing the seventh transistor 211, that is, the first diode, to be electrically coupled in parallel to the first transistor 111. Moreover, the eighth transistor 202 may operate as a first switch configured to electrically couple the seventh transistor 211 operating as a first diode to a current path of the first amplification unit 110, which is controlled by the input voltage Vin in response to activation of the active signal ACT.

The ninth transistor 213 may have a source to which the power supply voltage VDD is applied, and a gate electrically coupled to the drain of the eighth transistor 212.

The ninth transistor 213 may be configured to operate as a second diode.

The tenth transistor 214 may have a source electrically coupled to a drain of the ninth transistor 213, a gate through which the inverted active signal ACTB is received, and a drain electrically coupled to the gate of the ninth transistor 213.

When the inverted active signal ACTB has been activated to a logic low, the tenth transistor 214 may operate as a second switch for allowing the ninth transistor 213, that is, the second diode, to be electrically coupled in parallel to the second transistor 112. The tenth transistor 214 may operate as the second switch configured to electrically couple the ninth transistor 213 operating as a second diode to the current path of the first amplification unit 110, which is controlled by the reference voltage Vref, in response to the activation of the active signal ACT.

The compensation unit 210 may be configured to add a third current path and a fourth current path, which are electrically coupled the first amplification unit 110, in response to the active signal ACT, and to increase the amount of current of the first amplification unit 110. The compensation unit 210 may also be configured to compensate for a difference between an output operating point, which may define a level of the preliminary amplification signal OUT_PRE when the input voltage Vin is substantially equal to the reference voltage Vref, and a threshold voltage level of the single-input and single-ended amplifier through the third current path and the fourth current path.

The third current path may include the seventh transistor 211, the eighth transistor 212, the third transistor 113, and the sixth transistor 116. The third current path may be electrically coupled to the first current path. In addition, the third current path may include a diode and the first switch configured to electrically couple the diode to the first current path in response to the activation of the active signal ACT.

The fourth current path may include the ninth transistor 213, the tenth transistor 214, the fourth transistor 114, and the sixth transistor 116. The fourth current path may be electrically coupled to the second current path. Moreover, the fourth current path may include a diode and a second switch configured to electrically couple the diode to the second current path in response to an activation of the active signal ACT.

The operation of the amplification circuit 200 may be configured as above according to an embodiment will be described as follows.

In the standby mode, that is, when the standby mode signal STB has been activated to a logic high, the active signal ACT may be deactivated to a logic low and the inverted active signal ACTB may be deactivated to a logic high.

Since the standby mode signal STB has been activated to a logic high and the active signal ACT and the inverted active signal ACTB have been deactivated to the logic low and the logic high, the sixth transistor 116, the eighth transistor 212, and the tenth transistor 214 may be turned off and the fifth transistor 115 may be turned on.

By the difference in the amount of current between the first current path 111, 113, and 115 and the second current path 112, 114, and 115, the preliminary amplification signal OUT_PRE may be generated.

That is, the first to fourth transistors 111 to 114 may amplify the difference between the input voltage Vin and the reference voltage Vref by using an operating current decided by the fifth transistor 115, that is, a reduced operating current as compared with the sixth transistor 116, and generate the preliminary amplification signal OUT_PRE.

At this time, since the eighth transistor 212 and the tenth transistor 214 have been turned off, the third current path 211 and 212 and the fourth current path 213 and 214 may be blocked.

The second amplification unit 120 may secondarily amplify and invert the preliminary amplification signal OUT_PRE and generate the amplification signal OUT In the activation mode, that is, when the active signal ACT and the inverted active signal ACTB have been activated to the logic high and the logic low, the standby mode signal STB may be deactivated to a logic low.

Since the active signal ACT and the inverted active signal ACTB have been activated to the logic high and the logic low and the standby mode signal STB has been deactivated to a logic low, the fifth transistor 115 may be turned off and the sixth transistor 116, the eighth transistor 212, and the tenth transistor 214 may be turned on.

By the difference in the amount of current between the first and third current paths (111, 113, and 116)+(211 and 212) and the second and fourth current paths (112, 114, and 116)+(213 and 214), the preliminary amplification signal OUT_PRE may be generated.

That is, the first to fourth transistors 111 to 114 may amplify the difference between the input voltage Vin and the reference voltage Vref by using an operating current increased by the sixth transistor 116 and the seventh to tenth transistors 211 to 214 as compared with the standby mode, and generate the preliminary amplification signal OUT_PRE.

The second amplification unit 120 may secondarily amplify and invert the preliminary amplification signal OUT_PRE and generate the amplification signal OUT.

At this time, output when the two input of the first amplification unit 110, that is, the input voltage Vin and the reference voltage Vref are at substantially the same level will be defined as an output operating point.

When the output operating point of the first amplification unit 110 coincides with a logic threshold voltage of the second amplification unit 120, final output, that is, the amplification signal OUT may be generated without any error.

However, when a voltage gain of the first amplification unit 110 is smaller than a desired level, an error may occur in the amplification signal OUT.

Figure 3:
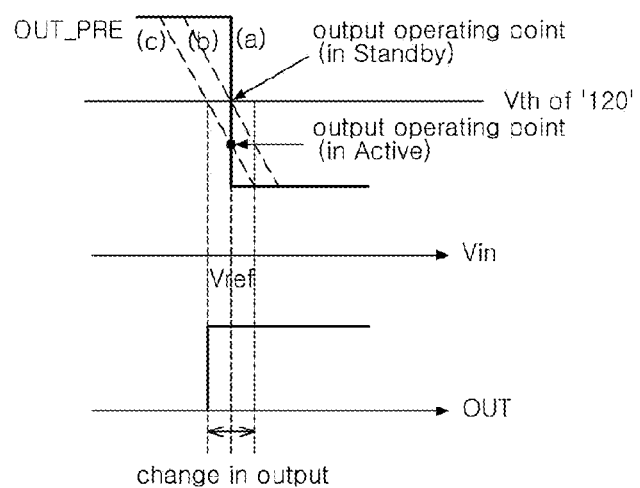
FIG. 3 is an output waveform diagram for explaining the operation characteristics of an amplification circuit 200 of FIG. 2.

Referring to FIG. 3, when the voltage gain of the first amplification unit 110 is equal to or more than the desired level, the preliminary amplification signal OUT_PRE may show output as indicated by (a).

However, when the voltage gain of the first amplification unit 110 is smaller than the desired level, the preliminary amplification signal OUT_PRE may show output as indicated by (b).

As an operating current of the activation mode increases, the output operating point of the first amplification unit 110 may be further lowered as indicated by (c) as compared with an output operating point of the standby mode. FIG. 3 also illustrates a change in output, Vth of '120', and also the input voltage Vin.

Accordingly, in an embodiment, as described above, the additional current paths, that is, the third current path and the fourth current path are formed in the activation mode, so that an output operating point is not reduced and an output operating point similar to that of the standby mode is obtained.

As described above, the amplification circuit 200 of the semiconductor apparatus according to an embodiment may be able to compensate for voltage gain reduction due to shrinkage in a process and reduction of the power supply voltage VDD, through secondary amplification, and to compensate for the reduction of an output operating point to achieve stable output characteristics.

Figure 4:
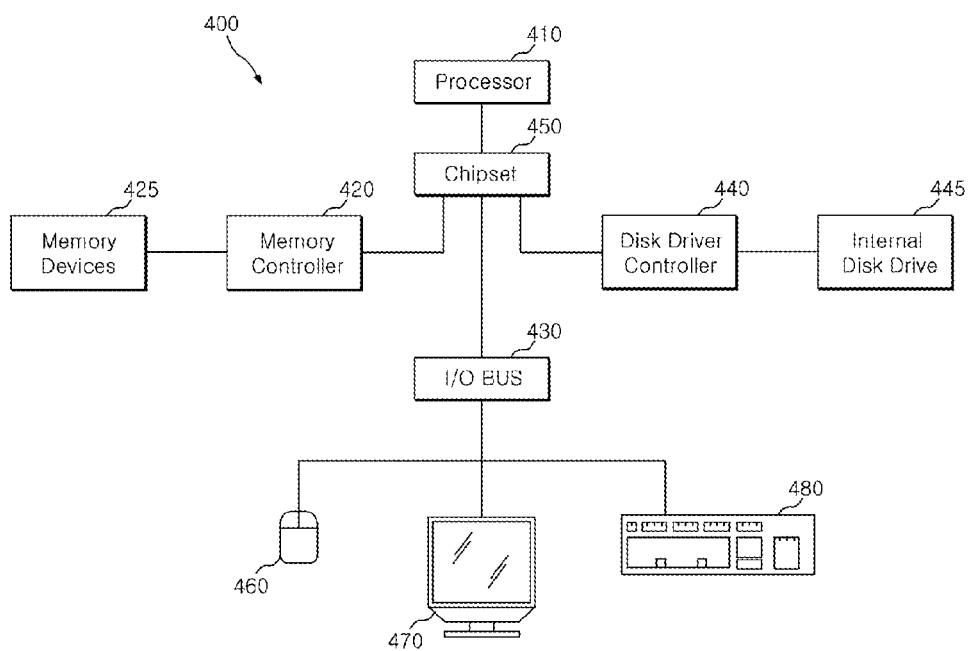
FIG. 4 is a block diagram of a system according to an embodiment of the invention.

The amplification circuit discussed above is particular useful in the design of processors, chipsets, or the like. For example, referring to FIG. 4, a block diagram of a system employing a processor and chipset in accordance with embodiments of the invention is illustrated and generally designated by reference numerals 410 and 450 respectively. The system 400 may include one or more processors or central processing units ("CPUs") 410. The CPU 410 may be used individually or in combination with other CPUs. While the CPU 410 will be referred to primarily in the singular, it will be understood by those skilled in the art that a system with any number of physical or logical CPUs may be implemented.

A chipset 450 may be operably coupled to the CPU 410. The chipset 450 is a communication pathway for signals between the CPU 410 and other components of the system 400, which may include a memory controller 420, memory device(s) 425, an input/output ("I/O") bus 430, and a disk drive controller 440, internal drive 445, and I/O devices 460, 470, and 480. Depending on the configuration of the system, any one of a number of different signals may be transmitted through the chipset 450, and those skilled in the art will appreciate that the routing of the signals throughout the system 400 can be readily adjusted without changing the underlying nature of the system.

As stated above, the memory controller 420 may be operably coupled to the chipset 450. Accordingly, the memory controller 420 can receive a request provided from the CPU 410, through the chipset 450. In an embodiment, the memory controller 420 may be integrated into the chipset 450. The chipset 450 may also be coupled to the I/O bus 430. The I/O bus 430 may serve as a communication pathway for signals from the chipset 450 to I/O devices 460, 470, and 480. The I/O devices 460, 470 and 480 may include a mouse 460, a video display 470, or a keyboard 480. The I/O bus 430 may employ any one of a number of communications protocols to communicate with the I/O devices 460, 470, and 480. Further, as mentioned before, the I/O bus 430 may be integrated into the chipset 430.

The disk drive controller 440 may also be operable coupled to the chipset 450. The disk drive controller 440 may serve as the communication pathway between the chipset 450 and one or more internal disk drives 445. The internal disk drive 445 may facilitate disconnection of the external data storage devices by storing both instructions and data. The disk drive controller 440 and the internal disk drives 445 may communicate with each other or with the chipset 450 using virtually any type of communication protocol, including all of those mentioned above with regard to the I/O bus 430.

While certain embodiments have been described above, it will be understood to those skilled in the art that the embodiments described are by way of example only. Accordingly, the amplification circuit of a semiconductor apparatus described herein should not be limited based on the described embodiments. Rather, the amplification circuit of a semiconductor apparatus described herein to should only be limited in light of the claims that follow when taken in conjunction with the above description and accompanying drawings.

What is claimed is:

1. An amplification circuit of a semiconductor apparatus, comprising:
   a first amplification unit configured to amplify a difference between an input voltage and a reference voltage and generate a preliminary amplification signal;
   a second amplification unit configured to secondarily amplify the preliminary amplification signal and generate an amplification signal; and
   a compensation unit configured to form an addition current path in response to an active signal.

2. The amplification circuit of a semiconductor apparatus according to claim 1, wherein the first amplification unit is configured to change an operating current in response to a standby mode signal and the active signal.

3. The amplification circuit of a semiconductor apparatus according to claim 1, wherein the compensation unit is configured to compensate for a difference between an output operating point, which defines a level of the preliminary amplification signal when the input voltage is equal to the reference voltage, and a threshold voltage level of the second amplification unit through the additional current path.

4. The amplification circuit of a semiconductor apparatus according to claim 1, wherein the compensation unit comprises:
   a first diode;
   a first switch configured to electrically couple the first diode to a current path of the first amplification unit, in response to activation of the active signal;
   a second diode; and
   a second switch configured to electrically couple the second diode to the current path of the first amplification unit, in response to the activation of the active signal.

5. An amplification circuit of a semiconductor apparatus, comprising:
- a differential-input and single-ended amplifier configured to amplify a voltage difference between a first current path and a second current path and generate a preliminary amplification signal;
- a single-input and single-ended amplifier configured to secondarily amplify the preliminary amplification signal and generate an amplification signal; and
- a compensation unit configured to form a third current path and a fourth current path in response to an active signal.

6. The amplification circuit of a semiconductor apparatus according to claim 5, wherein the differential-input and single-ended amplifier is configured to change an operating current in response to a standby mode signal and the active signal.

7. The amplification circuit of a semiconductor apparatus according to claim 5, wherein the differential-input and single-ended amplifier comprises:
- the first current path having a current amount that is controlled by an input voltage; and
- the second current path having a current amount that is controlled by a reference voltage.

8. The amplification circuit of a semiconductor apparatus according to claim 7, wherein an operating current of the first current path is configured to be changed in response to a standby mode signal and the active signal.

9. The amplification circuit of a semiconductor apparatus according to claim 7, wherein an operating current of the second current path is configured to be changed in response to a standby mode signal and the active signal.

10. The amplification circuit of a semiconductor apparatus according to claim 5, wherein the compensation unit comprises:
- the third current path electrically coupled to the first current path; and
- the fourth current path electrically coupled to the second current path.

11. The amplification circuit of a semiconductor apparatus according to claim 10, wherein the third current path comprises:
- a diode; and
- a switch configured to electrically couple the diode to the first current path in response to activation of the active signal.

12. The amplification circuit of a semiconductor apparatus according to claim 10, wherein the fourth current path comprises:
- a diode; and
- a switch configured to electrically couple the diode to the second current path in response to activation of the active signal.

13. The amplification circuit of a semiconductor apparatus according to claim 7, wherein the compensation unit is configured to compensate for a difference between an output operating point, which defines a level of the preliminary amplification signal when the input voltage is substantially equal to the reference voltage, and a threshold voltage level of the single-input and single-ended amplifier through the third current path and the fourth current path.

14. An amplification circuit of a semiconductor apparatus, comprising:
- a first amplification unit configured to consume an operating current in a standby mode that is lower than another operating current in a activation mode;
- a second amplification unit configured to generate an amplification signal by inverting a preliminary amplification signal; and
- a compensation unit configured to form one or more current paths in the first amplification unit in the activation mode.

15. The amplification circuit of claim 14, wherein the first amplification unit is configured with a plurality of transistors wherein at least one of the plurality of transistors has a lower current drivability than an other of the plurality of transistors.

16. The amplification circuit of claim 14, wherein the compensation unit is configured to add additional current paths to increase an amount of current of the first amplification unit.

17. The amplification circuit of claim 14, wherein a preliminary amplification signal is generated by a difference in an amount of current between the one or more current paths.

18. The amplification circuit of claim 14, wherein the second amplification unit amplifies the preliminary amplification signal to compensate for a reduction in power supply voltage and voltage gain.

19. The amplification circuit of claim 15, wherein the first amplification unit amplifies a difference between an input voltage and a reference voltage by using the operating current of one of the plurality of transistors.

20. The amplification circuit of claim 14, wherein the first amplification unit is configured to change one or more operating currents in the standby mode and the activation mode.

21. The amplification circuit of claim 1, wherein the active signal is activated when the semiconductor apparatus performs a data read or write operation.

22. The amplification circuit of claim 5, wherein the active signal is activated when the semiconductor apparatus performs a data read or write operation.

23. The amplification circuit of claim 14, wherein the activation mode, the semiconductor apparatus performs a data read or write operation.

* * * * *